United States Patent

Jones

Patent Number: 4,764,735
Date of Patent: Aug. 16, 1988

[54] PUSH-PULL TRANSFORMER FEED-BACK AMPLIFIER

[75] Inventor: Lee J. Jones, Sunrise, Fla.

[73] Assignee: Sunair Electronics, Inc., Ft. Lauderdale, Fla.

[21] Appl. No.: 907,465

[22] Filed: Sep. 15, 1986

[51] Int. Cl.$^4$ ............................................. H03F 3/26
[52] U.S. Cl. ...................................... 330/271; 330/276
[58] Field of Search ................... 330/81, 82, 119, 271, 330/276

[56] References Cited

U.S. PATENT DOCUMENTS

| | | | |
|---|---|---|---|
| 2,852,675 | 9/1958 | Oliver | 250/36 |
| 2,887,532 | 5/1959 | Werner | 179/1 |
| 3,111,630 | 11/1963 | Wolcott | 330/82 |
| 3,292,094 | 12/1966 | Jones | 330/15 |
| 3,324,407 | 6/1967 | Rockwell | 330/82 |

FOREIGN PATENT DOCUMENTS

1043401  11/1958  Fed. Rep. of Germany ...... 330/276

*Primary Examiner*—James B. Mullins
*Attorney, Agent, or Firm*—Oltman and Flynn

[57] ABSTRACT

Amplifier for radio frequencies including first and second common-base-connected transistors in push-pull coupling; an input transformer including two identical input windings each in series connection with the emitter of the respective first and second transistor and an input signal; an output transformer having a primary winding divided by a centertap into two identical half windings and having a start and an end terminal respectively connected to the collector of said first and second transistor and being connected to a supply potential at the centertap. The output transformer further includes a secondary winding connected to a load and identical first and second feedback windings in series connection with the respective emitter of said first and second transistor. Each feedback winding is such oriented that a fraction of the output signal is inserted in the input signal in opposite phase thereto for providing negative feedback.

15 Claims, 1 Drawing Sheet

PUSH-PULL TRANSFORMER FEED-BACK AMPLIFIER

BACKGROUND

The invention relates to an amplifier for electrical signals and more particularly to a low noise, wideband radio frequency amplifier.

Amplifiers of this type of the known art usually include one or several stages of amplifying components based on transistors or vacuum tubes having passive components such as resistors, capacitors and transformers forming the amplifying circuits. It is well known that all such components introduce a certain amount of electrical noise into the signal to be amplified. There are many types of noises that combine to produce a total noise signal. Sources of noise are the thermal noise produced by any type of resistor, and random noise in semi-conductor amplifiers known as shot noise, or generation-recombination noise produced by fluctuations in free carrier densities when an electric field is applied.

It is well known to use negative feed-back in an amplifier for controlling the amount of noise produced by the amplifier. Negative feed-back includes taking a portion of the output signal and feeding it back to the amplifier input and adjusting its phase so that the feed-back reduces the signal gain through the amplifier. The feed-back circuit can take many forms, depending upon the particular objects sought by the feed-back circuit.

SUMMARY OF THE INVENTION

Following is a description of the low noise, wideband radio frequency amplifier according to the invention. The amplifier also has low harmonic and intermodulation distortion. The amplifier uses a push-pull transformer feedback configuration, which is capable of providing high dynamic range amplification over a relatively wide bandwidth while providing low noise figure and good impedance match to both source and load. The amplifier in the preferred embodiment uses two transistors and two transformers in a push-pull arrangement to provide cancellation of even harmonic distortion. The transformer provides negative feedback in a non-dissipative manner, thereby producing simultaneously high dynamic range and a low noise figure. Furthermore, the completely balanced arrangement of the push-pull circuitry reduces even harmonic distortion products by at least 20 db relative to conventional prior art circuits which use a single transistor and one or more transformers.

It is accordingly a feature of the invention that the transistor amplifier includes first and second transistors that each have a base, a collector and an emitter. The two transistors have their bases connected to a common reference potential, e.g. ground potential. The transistor collectors are connected to the opposite end terminals of the primary winding of an output transformer, and a load is connected to the output transformer's secondary winding. The primary winding has a centertap dividing it into two identical halfwindings. The centertap is connected to a supply potential having a polarity such that the transistor's emitter-base junction is forward biased. An input transformer has two substantially identical input windings, each having a start terminal and an end terminal and a signal source having two signal terminals connected to the end terminal of the respective input windings. The output transformer includes two substantially identical feedback windings, each having a start terminal and an end terminal. One of the feedback windings has its end terminal connected to the emitter of one of the transistors and the start terminal connected to a respective start terminal of a respective input winding of the input transformmer, and the other feedback winding has its start terminal connected to the emitter of the other transistor and its end terminal connected to the start terminal of the other input winding. The primary winding, the secondary winding and the two feedback windings are all mutually inductively coupled, and the two input windings are also mutually inductively coupled.

Further objects and advantages of this invention will be apparent from the following detailed description of a presently preferred embodiment which is illustrated schematically in the accompanying drawings.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

DESCRIPTION OF THE PREFERRED EMBODIMENTS

In the figures and the description, a single prime ' and double prime " denotes components associated respectively with transistors Q1 and Q2 are shown in a push-pull amplifier configuration. Each transistor has a base, an emitter and a collector shown in the conventional transistor notation. The transistor collectors are connected to opposite ends of a primary winding 8 of an output transformer T2. The secondary winding 10 has a number of turns N such that the amplifier has its output impedance matched to the impedance of a load RO, in a well known manner.

The output transformer T2 further has two substantially identical feedback windings 6 and 7, each having a start terminal designated by a dot and an opposite end terminal. In the conventional transformer notation the dot indicates the starting point of the winding from where the turns are wound in clockwise direction toward the end terminal. Similarly, the primary winding 8 has its start terminal designated by a dot, connected to the collector of the first transistor Q1, and the end terminal connected to the collector of the second transistor Q2.

Figure 1:
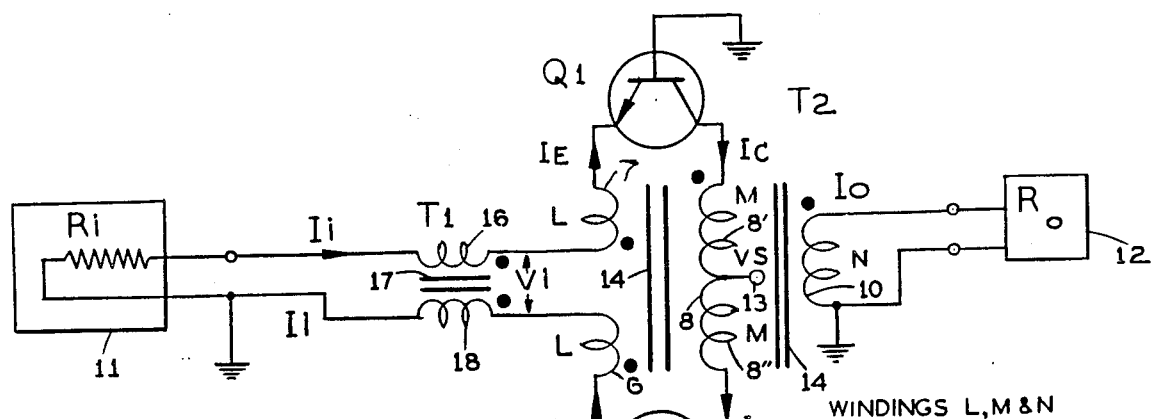
FIG. 1 is a simplified schematic diagram of the amplifier according to the invention showing two transistors in push-pull coupling with an input and an output transformer.

The base of the two transistors Q1 and Q2 are connected to reference potential, designated by a ground symbol; but the reference potential need not be ground but can have any other dc-potential. The reference potential, however, is always required to have a dc-potential relative to a supply potential VS connected to a centertap 13 of the primary winding 8 such that the transistor's base-emitter junction is forward biased, irregardless of the conductivity type of the transistor. In FIG. 1 the transistors are shown as NPN-transistors, and accordingly the supply potential VS is positive, relative to reference potential, while, with PNP transistors, the opposite polarity would be required.

An input transformer T1 in FIG. 1 has two substantially identical input windings 16 and 18, of which the start terminal of winding 16 is connected to the start terminal of feedback winding 7 and the start terminal of input winding 18 is connected to the end terminal of feedback winding 6.

The end terminals of input windings 16 and 18 are connected to the two signal terminals of a signal source 11 providing the input signal for the amplifier.

The signal source 11 has an internal impedance, which for the purpose of making FIG. 1 operable is assumed to have negligible dc-resistance, so that the emitter current from Q1 can flow back to reference potential VR. The input transformer T1 transforms the input signal into a balanced signal in well known manner. The two transistors Q1 and Q2 are shown driven at their emitters with their bases connected to reference potential VR. The input signal is amplified in the two transistors Q1 and Q2 and appears as the amplified signal at the two collectors that are connected respectively to the start terminal and the end terminal of the primary winding 8. The secondary winding 10 of the output transformer 14 drives the load 12. The two feedback windings 6 and 7 feed back a fraction of the output signal to the emitter circuits of the transistors Q1 and Q2. The feedback windings are connected such that the feedback signal, or at least a component thereof, is in opposing phase to the input signal from the input transformer T1, thereby providing a negative feedback which reduces the magnitude of the input signal present at the emitters. The negative feedback in turn operates to improve the signal/noise ratio of the amplifier, which is well known from amplifier theory.

The form of feedback provided by the feedback according to the instant invention, however, has the unique advantage that no energy, or very little energy is lost by dissipation in resistive feedback components as used in conventional amplifiers. As a result, the amplifier provides a better overall performance in relation to the bandwidth-gain product and in the signal/noise ratio, as described and shown in more detail in the following quantitative analysis.

In FIG. 1 which is a simplified schematic diagram of the Push-Pull Transformer Feedback Amplifier, the initial design assumptions are: $I_e = I_c$ wherein $I_e$ is the emitter current and $I_c$ is the collector current for each transistor Q1 and Q2 and the resistance presented by the transistor emitters ($R_e$) is at least an order of magnitude less than the stage input impedance ($R_i$) and can be assumed to be zero. Then, to balance the ampere-turns in the transformer T2 it can be written:

$$2I_iL + 2I_cM = I_oN \quad (1)$$

wherein L, M and N are the respective number of turns of the feedback windings (6, 7), the half-windings (8', 8'') of the output transformer primary 8 and the secondary 10.

From (1), it follows that $$I_o = \frac{I_i(2L + 2M)}{N} = I_iG_x \text{ ($G_x$ is the current gain.)} \quad (2)$$

Equating volts per turn produces:

$$\frac{V_i}{2L} = \frac{V_c}{M} = \frac{V_o}{N}. \text{ Thus, } V_o = \frac{V_iN}{2L} \text{ and } V_c = \frac{V_oM}{n}. \quad (3)$$

The voltage gain $$G_v = \frac{V_o}{V_i} = \frac{N}{2L},$$

and the power gain is the product of the voltage gain and the current gain:

$$G_p = G_xG_v = \frac{2L + 2M}{N} \cdot \frac{N}{2L} = 1 + \frac{M}{L}. \quad (4)$$

The input resistance $$R_i = \frac{V_i}{I_i}, \text{ or} \quad (5)$$

$$R_i = \frac{V_o(2L/N)}{I_oN/(2L + 2M)} = R_o\frac{4L^2 + 4LM}{N^2}, \text{ and}$$

$$\frac{R_i}{R_o} = \frac{4L^2 + 4LM}{N^2}.$$

The collector load resistance $$R_c = \frac{V_c}{I_c}, \text{ or} \quad (6)$$

$$R_c = \frac{V_o(M/N)}{I_oN/(2L + 2M)} = R_o\frac{M(2L + 2M)}{N^2}.$$

If the feedback windings have one turn each, the following relations result:

$$L = 1, \text{ Therefore } \frac{R_i}{R_o} = \frac{4 + 4M}{N^2}, \text{ and} \quad (7)$$

$$R_c = R_o\frac{M(2 + 2M)}{N^2} = \frac{R_iM}{2} \quad (8)$$

When $L = 1$ and $R_1 = R_o$, $N^2 = 4 + 4M$ (9)

Figure 2:
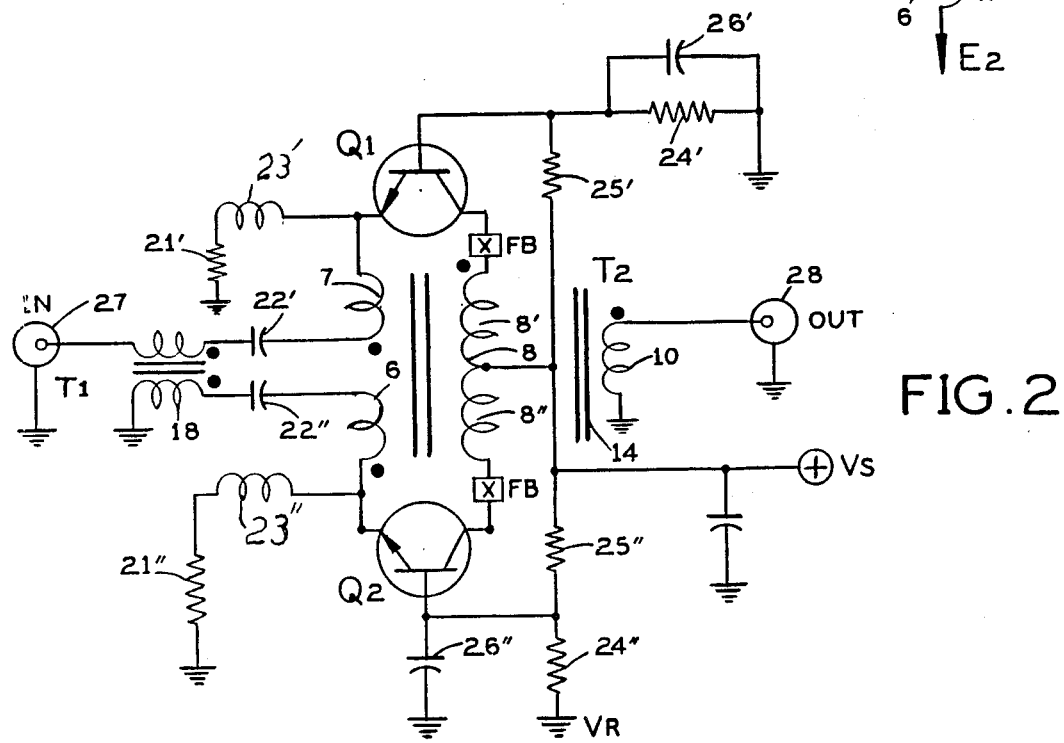
FIG. 2 is schematic diagram of the amplifier according to the invention in a practical realization thereof, showing additional supporting components.

FIG. 2 shows in more detail a practical realization of the amplifier according to the invention. In the emitter circuit the dc component of the emitter current $I_E$ is decoupled from the input transformer T1 by means of capacitors 22' and 22'' in the emitter circuit of transistors Q1 and Q2 respectively, and instead flows through bypass components, inductors 23' and 23'' and resistor 21' and 22'' for transistors Q1 and Q2 respectively.

Additionally, the base of transistors Q1 and Q2 are connected to a respective tap of voltage dividers formed by resistors 25', 24' and 25'', 24'', connected between supply potential Vs shown as +12 v and reference potential $V_r$, shown by a ground symbol.

An ac-bypass capacitor 26', 26'' is connected between the base and reference potential for the respective transistors Q1 and Q2.

The input signal is seen provided as an unbalanced signal from a connector 27, which is typically a coaxial connector connected to a coaxial cable (not shown) having a characteristic impedance of 50 ohms. Similarly, the output signal from winding 10 of the output transformer T2 is shown as an unbalanced signal connected to a connector 28, which also typically may be a coaxial connector connected to a coaxial cable of 50 ohms.

The transformers T1 and T2 in the figures have the respective cores 17 and 14, which typically are so-called ferrite powder cores, but the transformers may alternatively have no cores at all.

The amplifier according to FIG. 2 has shown performance figures in the range 1–40 mHz with a gain of 9.5 dB, using typical high frequency transistors.

In order to suppress a tendency to generate parasitic oscillations, ferrite beads may be inserted at points FB in the collector circuit for each transistor Q1, Q2.

In FIG. 2, which is a practical example of the push-pull Transformer Feedback Amplifier according to the invention, the amplifier is designed for 9.5. dB gain and 50 Ohm impedances over a frequency band of 1.6 to 32 mHz.

Assuming L is 1 turn and the power gain $G_p$ is 9.5 dB, then, from (4):

$$M+1=9, \text{ and } M=8.$$

For equal input and output impedances (50 Ohms):

$$\frac{R_i}{R_o} = 1 = \frac{4 + 4M}{N^2} = \frac{36}{N^2},$$

thus N=6 turns.

The measured performance of a typical embodiment of the amplifier is as follows:

| | | |
|---|---|---|
| Third order input intercept point | | +34 dBm |
| Second order input intercept point | | +76 dBm |
| Harmonic output with 10dBm input | 2nd harm. | −66 dBc |
| | 3rd harm. | −63 dBc |
| Input return loss 1.6–32 mHz | Greater than | 30 dB |
| Power gain | | 9 dB |
| Reverse gain | | −10 dB |
| Noise Figure | | 2.5 dB |

The performance figures show that the amplifier according to the invention can have performance for bandwidth, gain, harmonic suppression and noise suppression that are well ahead of the performance for amplifiers of conventional construction.

Figure 3:
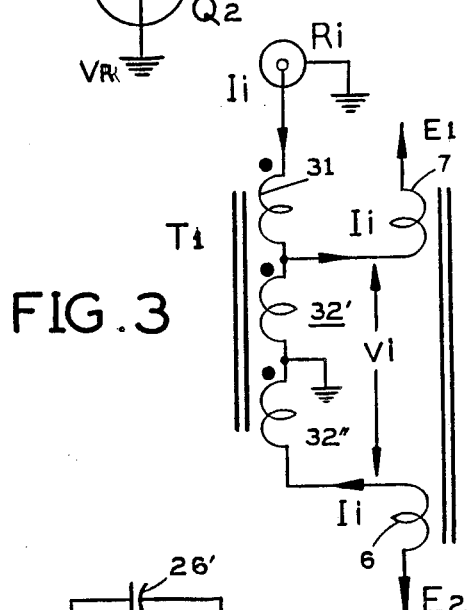
FIG. 3 is a diagram of an alternate embodiment of the input circuit of the amplifier.

FIG. 3 shows an alternative construction for the input transformer T1 having three series-connected first, second and third input windings 31, 32′ and 32″. In this construction, the unbalanced input signal is connected to the start terminal of input winding 31, and the emitters E1 and E2 of the respective transistors Q1 and Q2 are connected respectively to the first junction formed by the end terminal of input winding 31 and the start terminal of second input winding 32′ and of the end terminal of the third input winding 32″. The second junction formed by the end terminal of the second input winding 32′ and the start terminal of the third input winding 32″ is connected to reference potential VR, which also serves as a return point for the emitter currents of the two transistors Q1 and Q2.

I claim:

1. Amplifier for radio frequencies, comprising:
   first and second common-base-connected transistors in push-pull coupling;
   an input transformer including two substantially identical input windings each in series connection with the emitter of the respective first and second transistors and two sides of an input signal;
   an output transformer having a primary winding divided by a centertap into two substantially identical halfwindings and having a start and an end terminal respectively connected to the collector of said first and second transistors, a supply potential being connected to said centertap, and a reference potential being connected to the base of said first and second transistors, a secondary winding connected to a load, and identical first and second feedback windings each having a start and an end terminal, each feedback winding being connected in series with the emitter of a respective transistor, each feedback winding being such oriented that a fraction of the output signal is being inserted in the input signal in opposite phase thereto for providing negative feedback.

2. Amplifier according to claim 1 including a voltage divider for each of the first and second transistors, the voltage divider having a first resistor connected at one end to the supply potential, and a second resistor connected at one end to the reference potential, the other end of each resistor being jointly connected to the base of a respective transistor, for providing a base bias potential.

3. Amplifier according to claim 2 including a bypass capacitor connected from the base of the respective first and second transistor to reference potential for providing ac-bypass for the respective base.

4. Amplifier according to claim 3 including an emitter decoupling network for each emitter of the respective first and second transistor, the decoupling network including a decoupling capacitor inserted in the emitter circuit and an emitter resistor connected from reference potential to the emitter of the respective transistor.

5. Amplifier according to claim 4 including an inductor in series connection with said emitter resistor for impeding ac-current flowing therein.

6. Amplifier according to claim 5 including a ferrite bead inserted in series with the collector of each of said transistors for stopping parasitic oscillations.

7. Amplifier according to claim 6 wherein said input and said output transformer includes a ferrite core.

8. Amplifier according to claim 1 including a ferrite bead inserted in series with the collector of each of said transistors for stopping parasitic oscillations.

9. Amplifier according to claim 1 wherein said input signal is unbalanced, having one side thereof at reference potential.

10. Amplifier according to claim 9 wherein said output signal is unbalanced, having one side thereof at reference potential.

11. Amplifier according to claim 1 wherein said input and said output transformer includes a ferrite core.

12. Amplifier for radio frequencies, comprising:
    first and second common-base connected transistors in push-pull coupling;
    an input transformer including a first input winding and substantially identical second and third input windings, said first, second and third windings being connected in series and each having a start and an end terminal, the start terminal of the first input winding being connected to an input signal, the end terminal of the first input winding being connected to the start terminal of the second input winding, forming a first junction, and the end terminal of the second input winding being connected to the start terminal of the third input winding, forming a second junction;

an output transformer having a primary winding divided by a centertap into two identical half windings and having a start and an end terminal respectively connected to the collector of said first and second transistors, a supply potential being connected to the centertap, and a reference potential being connected to said second junction, the output transformer further having a secondary winding connected to a load, and substantially identical first and second feedback windings, each having a start and an end terminal, the first feedback winding being connected at its start terminal to said first junction and at its end terminal to the emitter of the first transistor, the second feedback winding being connected at its start terminal to the emitter of said second transistor and at the end terminal to the end terminal of said third input winding for inserting a negative feedback voltage in the emitter circuit of the respective transistor.

13. Amplifier according to claim 12 including a voltage divider for each of the first and second transistors, the voltage divider having a first resistor connected at one end to supply potential, and a second resistor connected at one end to said reference potential, the other end of said first and second resistor being jointly connected to the base of a respective transistor for providing a base bias potential.

14. Amplifier according to claim 13 including a ferrite bead in the collector of said first and second transistor.

15. Amplifier according to claim 14 wherein said input and output transformer includes a ferrite core.

* * * * *